(12) United States Patent
Kitagawa

(10) Patent No.: US 9,554,462 B2
(45) Date of Patent: Jan. 24, 2017

(54) PRINTED WIRING BOARD

(71) Applicant: IBIDEN CO., LTD., Ogaki-shi (JP)

(72) Inventor: Katsutoshi Kitagawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 14 days.

(21) Appl. No.: 14/640,502

(22) Filed: Mar. 6, 2015

(65) Prior Publication Data
US 2015/0257261 A1    Sep. 10, 2015

(30) Foreign Application Priority Data

Mar. 7, 2014  (JP) ................................. 2014-045349

(51) Int. Cl.
*H05K 1/00* (2006.01)
*H05K 1/02* (2006.01)
(Continued)

(52) U.S. Cl.
CPC ........... *H05K 1/0298* (2013.01); *H01L 21/486* (2013.01); *H01L 23/49827* (2013.01);
(Continued)

(58) Field of Classification Search
CPC .............. H05K 1/02; H05K 1/03; H05K 1/05; H05K 1/11; H05K 1/18; H05K 3/00; H05K 3/02; H05K 3/42; H05K 3/44; H05K 3/46; H05K 7/20; H01L 21/48; H01L 21/56; H01L 21/306; H01L 23/00;H01L 23/04; H01L 23/10; H01L 23/12; H01L 23/15; H01L 23/34; H01L 23/48; H01L 23/52; H01L 23/552
(Continued)

(56) References Cited

U.S. PATENT DOCUMENTS 4,794,048 A * 12/1988 Oboodi ..................... C03C 8/02
156/89.16
4,823,234 A * 4/1989 Konishi .................. H01L 21/56
174/548

(Continued)

FOREIGN PATENT DOCUMENTS

JP    2014-086651 A    5/2014

*Primary Examiner* — Xiaoliang Chen
(74) *Attorney, Agent, or Firm* — Oblon, McClelland, Maier & Neustadt, L.L.P.

(57) ABSTRACT

A printed wiring board includes a multilayer core substrate, a first buildup layer formed on the multilayer core substrate and including an interlayer insulation layer and a conductive layer, a second buildup layer formed on the multilayer core substrate and including an interlayer resin insulation layer and a conductive layer, and an end-surface through hole conductor formed on side surfaces of the first and second buildup layers and core substrate such that the through hole conductor connects the conductive layers of the first and second buildup layers. The core substrate includes a first conductive layer, a middle conductive layer, a second conductive layer, a first insulation layer between the first and middle conductive layers and a second insulation layer between the second and middle conductive layers, and the middle conductive layer is connected to the through-hole conductor and has thickness greater than thicknesses of the first and second conductive layers.

20 Claims, 11 Drawing Sheets

(51) Int. Cl.
*H01L 23/498* (2006.01)
*H05K 1/18* (2006.01)
*H05K 1/11* (2006.01)
*H05K 1/03* (2006.01)
*H01L 23/367* (2006.01)
*H01L 21/48* (2006.01)

(52) U.S. Cl.
CPC ........... *H05K 1/0203* (2013.01); *H05K 1/032* (2013.01); *H05K 1/115* (2013.01); *H05K 1/18* (2013.01); *H01L 21/4857* (2013.01); *H01L 23/367* (2013.01); *H01L 23/49822* (2013.01); *H01L 2224/16225* (2013.01); *H01L 2924/15311* (2013.01); *H01L 2924/16152* (2013.01); *H05K 2201/0335* (2013.01)

(58) Field of Classification Search
USPC ................ 174/152, 255, 256, 259–264, 377, 528,174/548; 361/712, 717, 718, 760, 764, 792; 428/76, 137, 209, 432; 257/659, 678, 693, 257/704, 738, 778; 29/852
See application file for complete search history.

(56) References Cited

U.S. PATENT DOCUMENTS

| | | | | |
|---|---|---|---|---|
| 4,997,698 A * | 3/1991 | Oboodi | ............... | C03C 10/0045 257/E23.009 |
| 5,311,402 A * | 5/1994 | Kobayashi | ............... | H01L 21/52 174/17.05 |
| 5,394,011 A * | 2/1995 | Yamamoto | ............... | H01L 23/10 257/693 |
| 5,841,190 A * | 11/1998 | Noda | .................. | H01L 23/3107 257/668 |
| 6,506,982 B1 * | 1/2003 | Shigi | ...................... | H05K 3/403 174/260 |
| 6,534,723 B1 * | 3/2003 | Asai | .................. | H01L 23/49811 174/255 |
| 6,548,767 B1 * | 4/2003 | Lee | ....................... | H05K 1/115 174/255 |
| 6,711,812 B1 * | 3/2004 | Lu | ....................... | H01L 23/3677 174/262 |
| 2001/0040048 A1 * | 11/2001 | Achari | ................ | H05K 3/4038 174/255 |
| 2003/0136577 A1 * | 7/2003 | Abe | ....................... | H01L 23/142 174/255 |
| 2003/0168249 A1 * | 9/2003 | Ito | ........................ | H05K 3/0052 174/255 |
| 2003/0215619 A1 * | 11/2003 | Ooi | ....................... | H05K 3/429 428/209 |
| 2004/0065960 A1 * | 4/2004 | Egitto | ................... | H01L 21/486 257/774 |
| 2004/0231872 A1 * | 11/2004 | Arnold | ................... | H01L 23/04 174/377 |
| 2005/0205988 A1 * | 9/2005 | Radza | ...................... | H01L 23/04 257/704 |
| 2005/0220425 A1 * | 10/2005 | Kropp | .................. | G02B 6/4292 385/88 |
| 2006/0083895 A1 * | 4/2006 | Ikeda | ...................... | B32B 3/10 428/137 |
| 2008/0302563 A1 * | 12/2008 | Ohsumi | ............ | H01L 23/49816 174/263 |
| 2009/0053459 A1 * | 2/2009 | Hirose | .................. | H05K 1/112 428/76 |
| 2009/0115073 A1 * | 5/2009 | Sunohara | ............. | H05K 1/0271 257/778 |
| 2009/0236700 A1 * | 9/2009 | Moriya | ................... | H01L 23/29 257/659 |
| 2010/0018758 A1 * | 1/2010 | Yoshimura | ........... | H05K 3/4608 174/256 |
| 2012/0014068 A1 * | 1/2012 | Nakanishi | ............... | H01L 23/10 361/717 |
| 2013/0078811 A1 * | 3/2013 | Bates | .................. | H01L 21/3212 438/692 |
| 2013/0092651 A1 * | 4/2013 | Bates | .................. | C09K 3/1463 216/13 |
| 2014/0007682 A1 * | 1/2014 | Kabasawa | ............. | G01C 19/56 73/504.12 |
| 2014/0055956 A1 * | 2/2014 | Nakamura | .......... | H01L 23/3735 361/712 |
| 2014/0116759 A1 * | 5/2014 | Watanabe | ............ | H05K 1/0206 174/255 |
| 2014/0252612 A1 * | 9/2014 | Nakagawa | ............... | H01L 23/12 257/738 |

\* cited by examiner

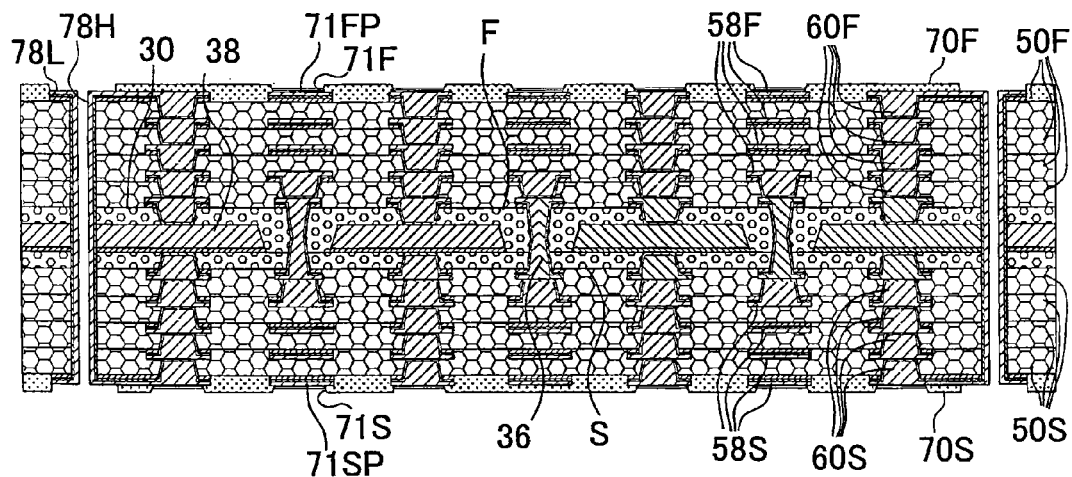
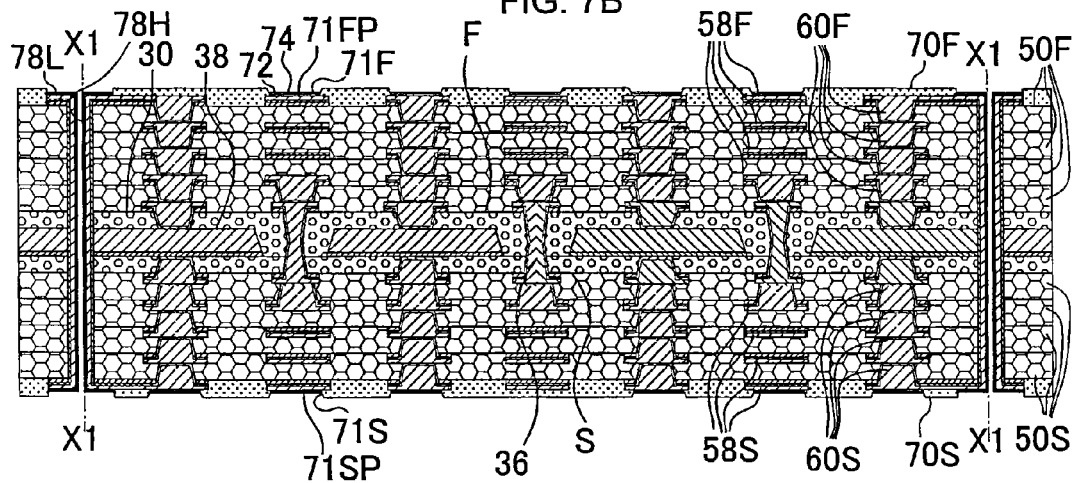
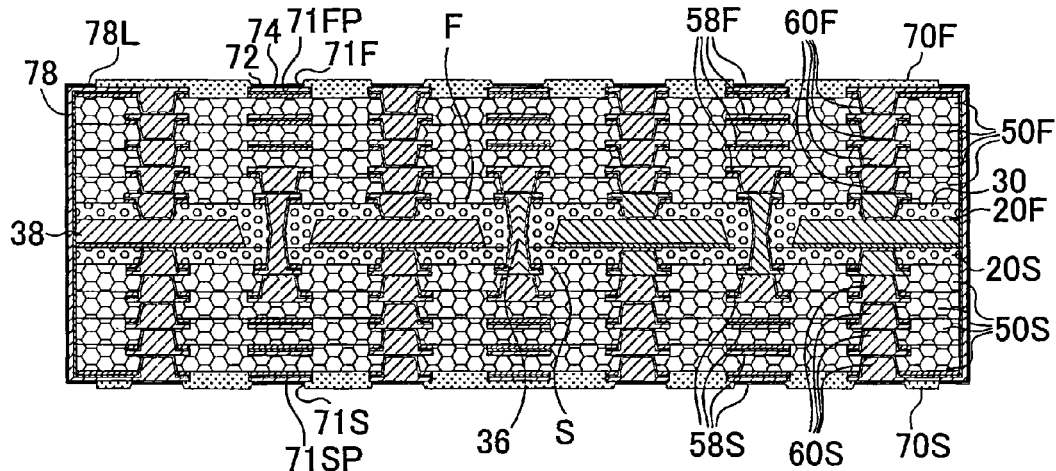

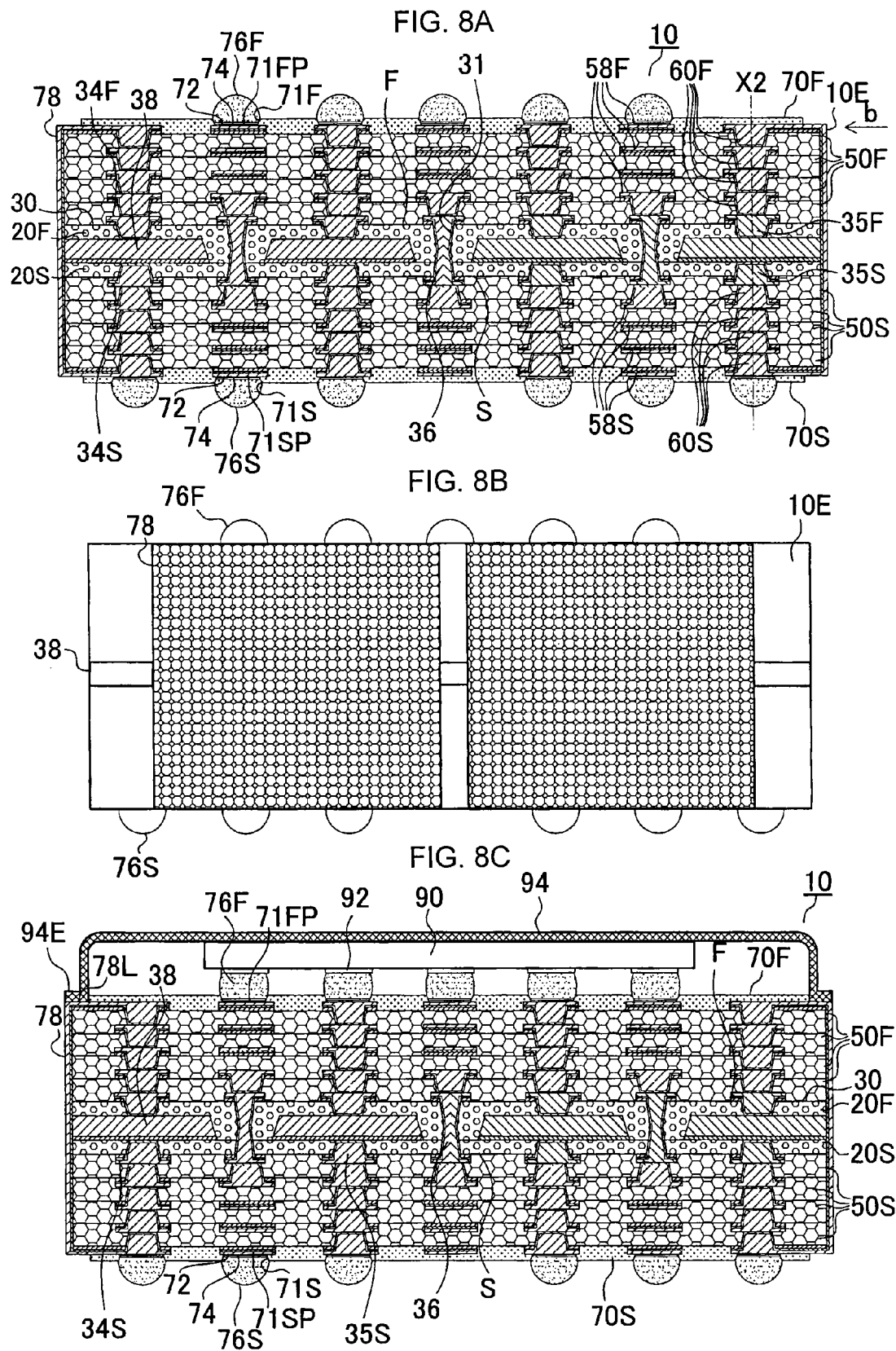

… (1) …

PRINTED WIRING BOARD

CROSS-REFERENCE TO RELATED APPLICATIONS

The present application is based upon and claims the benefit of priority to Japanese Patent Application No. 2014-045349, filed Mar. 7, 2014, the entire contents of which are incorporated herein by reference

BACKGROUND OF THE INVENTION

Field of the Invention

The present invention relates to a multilayer buildup printed wiring board having a middle conductive layer in the core substrate.

Description of Background Art

JP 2014-086651A describes a method for manufacturing a metal-core substrate, which is an application of a coreless method for forming a wiring board without using a core substrate. The entire contents of this publication are incorporated herein by reference.

SUMMARY OF THE INVENTION

According to one aspect of the present invention, a printed wiring board includes a multilayer core substrate, a first buildup layer formed on a first surface of the multilayer core substrate and including an interlayer resin insulation layer and a conductive layer, a second buildup layer formed on a second surface of the multilayer core substrate and including an interlayer resin insulation layer and a conductive layer, and an end-surface through hole conductor formed along a side surface of the first buildup layer, a side surface of the multilayer core substrate and a side surface of the second buildup layer such that the end-surface through hole conductor is connecting the conductive layer of the first buildup layer and the conductive layer of the second buildup layer. The multilayer core substrate includes a first conductive layer, a middle conductive layer, a second conductive layer, a first insulation layer interposed between the first conductive layer and the middle conductive layer and a second insulation layer interposed between the second conductive layer and the middle conductive layer, and the middle conductive layer is connected to the end-surface through-hole conductor and has a thickness which is greater than thicknesses of the first and second conductive layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7A-7C show views of steps in the method for manufacturing a printed wiring board according to the first embodiment;

FIGS. 8A and 8C show cross-sectional views of a printed wiring board of the first embodiment, and FIG. 8B shows a side view of the printed wiring board;

DETAILED DESCRIPTION OF THE EMBODIMENTS

Figure 1A:
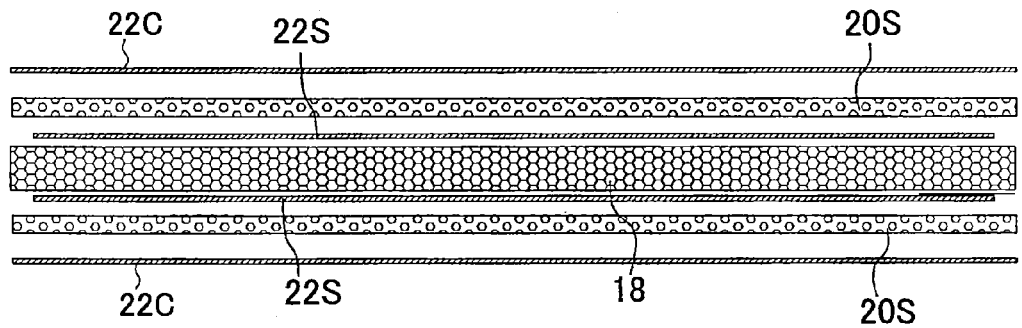
FIG. 1A-1D show views of steps in a method for manufacturing a printed wiring board according to a first embodiment of the present invention.

The embodiments will now be described with reference to the accompanying drawings, wherein like reference numerals designate corresponding or identical elements throughout the various drawings.

First Embodiment

FIG. 8A shows a printed wiring board of a first embodiment. Printed wiring board 10 has core substrate 30 formed with upper insulation layer (20F) and lower insulation layer (20S).

Figure 4A:
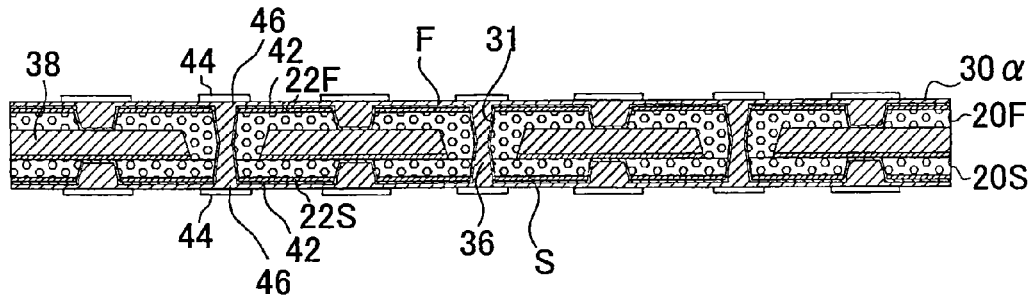
FIG. 4A-4D show views of steps in the method for manufacturing a printed wiring board according to the first embodiment.
Figure 4B:
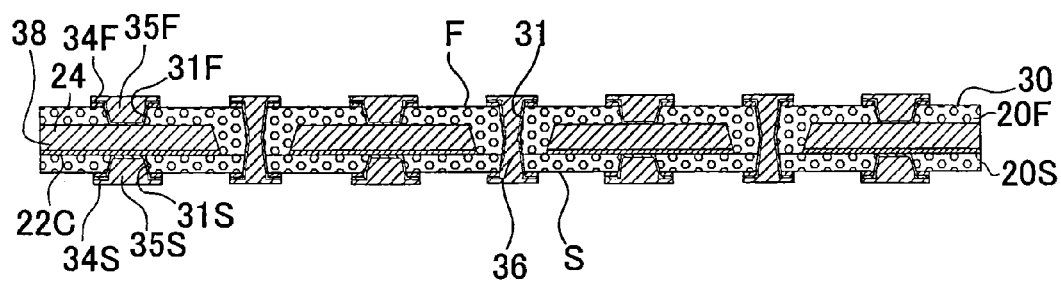

FIG. 4B shows core substrate 30. Upper conductive layer (34F) is formed on upper insulation layer (20F) and lower conductive layer (34S) is formed under lower insulation layer (20S). Middle conductive layer 38 is formed between the upper insulation layer and the lower insulation layer. Upper via conductor (35F) is formed in opening (31F) of upper insulation layer (20F) to connect upper conductive layer (34F) and middle conductive layer 38. Lower via conductor (35S) is formed in opening (31S) of lower insulation layer (20S) to connect lower conductive layer (34S) and middle conductive layer 38. Middle conductive layer 38 is formed by patterning core metal foil (22C) and electrolytic plated film 24 formed on core metal foil (22C). Upper via conductor (35F) is formed to taper with a diameter decreasing downward, and lower via conductor (35S) is formed to taper with a diameter decreasing upward.

As shown in FIG. 8A, in a printed wiring board of the first embodiment, four layers of first insulation layers (50F) each having first conductive layer (58F) and first via conductor (60F) are built up on first surface (F) of core substrate 30, while four layers of second insulation layers (50S) each having second conductive layer (58S) and second via conductor (60S) are built up on second surface (S) of core substrate 30. Solder-resist layer (70F) is formed on the uppermost first insulation layer (50F), and solder bump (76F) is formed in opening (71F) of solder-resist layer (70F). Solder-resist layer (70S) is formed on the lowermost second insulation layer (50S), and solder bump (76S) is formed in opening (71S) of solder-resist layer (70S).

FIG. 8B is a side view of the printed wiring board shown in FIG. 8A. Namely, FIG. 8B is a view showing sidewall (10E) as seen from the direction of arrow "b" in FIG. 8A. Middle conductive layer 38 is extended to sidewall (10E) to be exposed thereon. End-surface through hole 78, which is a half-split through hole, is exposed on sidewall (10E). Middle conductive layer 38 and end-surface through hole 78 are connected to each other. End-surface through hole 78 is formed on each of four side surfaces of a rectangular printed wiring board. End-surface through hole 78 connects part of conductive layer (58F) on outermost upper buildup layer (50F) and part of conductive layer (58S) on outermost lower buildup layer (50S).

Printed wiring board 10 of the first embodiment is structured to have a middle conductive layer 38 positioned in the center of core substrate 30. Thus, because of the rigidity of thick middle conductive layer 38, warping is suppressed in printed wiring board 10, and demand for thinner boards is satisfied.

Thermal conductivity of printed wiring board 10 of the first embodiment is improved by middle conductive layer 38 made of metal. Since middle conductive layer 38, which is formed in the center of core substrate 30 and set to be thick, is connected to end-surface through holes 78 provided on end surfaces of printed wiring board 10, heat in the printed wiring board is efficiently radiated through end-surface through holes 78. Accordingly, heat radiation is high. Moreover, the printed wiring board is provided with filled vias (60F, 60S), which are formed in all the upper buildup layers (50F) and lower buildup layers (50S) respectively and are arrayed along axis (X2) of upper via conductor (35F) and its opposing lower via conductor (35S) that are connected to middle conductive layer 38. Therefore, heat generated in the electronic component mounted on the upper surface is efficiently radiated toward the lower-surface side.

The printed wiring board of the first embodiment has through-hole conductor 36 connecting upper conductive layer (34F) and lower conductive layer (34S). Via conductors (60F, 60S) in the interlayer resin insulation layers are formed to be filled vias.

FIG. 8C shows a view where electronic component 90 such as an IC chip is mounted on the printed wiring board shown in FIG. 8A and metallic encapsulating cap 94 (heat radiation member) is fixed thereon. Electronic component 90 is mounted by connecting terminal 92 to solder bump (76F) of the printed wiring board. Edge (94E) of cap 94 is connected to land (78L) of end-surface through hole 78. The upper surface of electronic component 90 is in contact with cap 94. In the first embodiment, since heat generated in the electronic component is conducted directly to end-surface through hole 78 by way of cap 94, heat from the mounted electronic component is efficiently radiated. In the first embodiment, since cap 94 and middle conductive layer 38 are connected to a power line or a ground line, noise from the electronic component is suppressed from adversely affecting the outside.

Manufacturing Method in First Embodiment

A method for manufacturing printed wiring board 10 of the first embodiment is shown with reference to FIG. 1~6.

Figure 1B:
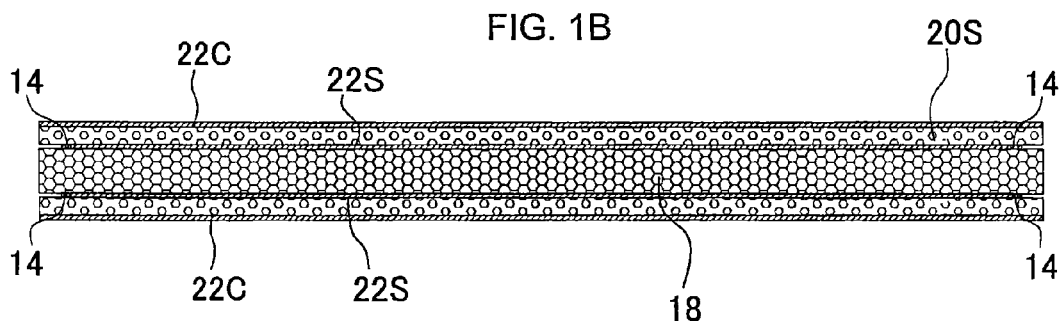

(1) Support plate 18 is prepared. Support plate 18 is, for example, a copper-clad laminate (double-sided copper-clad laminate) made of an insulative base and copper foil (not shown) laminated on both surfaces of the insulative base. The support plate has a first surface and a second surface opposite the first surface. Lower metal foil (22S) is provided on the first and second surfaces of support plate 18. Metal foil (22S) is a copper foil, for example, and has a thickness of 12 μm. B-stage resin film 22 is provided to be placed on lower metal foil (22S), and core metal foil (22C) is provided to be placed on resin film 22 (FIG. 1A). The thickness of core metal foil (22C) is 12 μm. Lower metal foil (22S) is laminated on the first and second surfaces of support plate 18. The peripheries of the metal foil and the support plate are fixed to each other. The copper-clad laminate and metal foil are bonded using ultrasonic waves. The metal foil and the support plate are bonded at fixed portion 14. The width of the fixed portion is 30 mm. The fixed portion is in a frame shape. B-stage resin film is laminated on lower metal foil (22S), and core metal foil (22C) is further laminated thereon (FIG. 1B). Then, the resin film is cured, and lower insulation layer (20S) is formed on the support plate accordingly. Lower insulation layer (20S) contains inorganic particles and includes a core material. Examples of inorganic particles are those made of silica, alumina and hydroxides. Examples of hydroxides are metal hydroxides such as aluminum hydroxide, magnesium hydroxide, calcium hydroxide, and barium hydroxide. Hydroxides are decomposed by heat to produce water. As a result, hydroxides are thought to rob heat of the material forming insulation layers. Namely, when lower insulation layer (20S) contains a hydroxide, laser processability is thought to be enhanced. As for the core material (reinforcement material), glass cloth, aramid fiber, glass fiber or the like, for example, may be used. Among those, glass cloth is preferred.

Figure 1C:
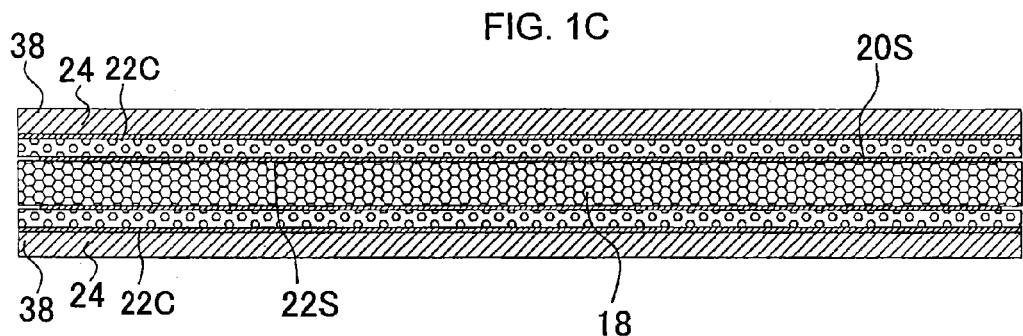

(2) Electrolytic plated film 24 is formed on core metal foil (22C) to form middle conductive layer 38 made up of metal foil (22C) and electrolytic plated film 24 (FIG. 1C).

Figure 1D:
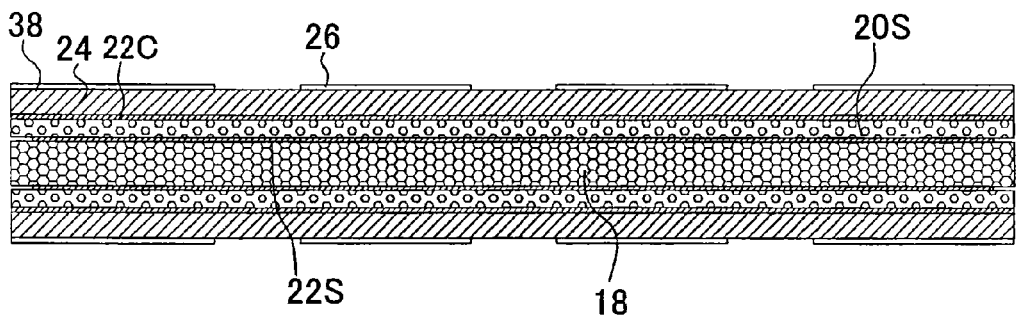

(3) Etching resist 26 with a predetermined pattern is formed on electrolytic plated film 24 (FIG. 1D).

Figure 2A:
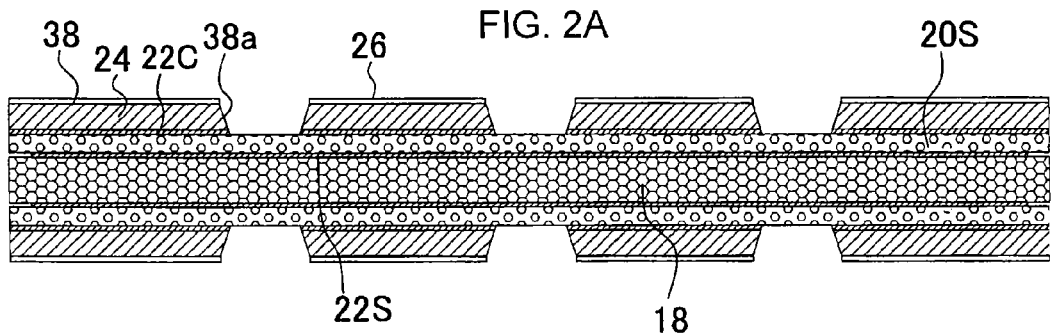
FIG. 2A-2D show views of steps in the method for manufacturing a printed wiring board according to the first embodiment.
Figure 2B:
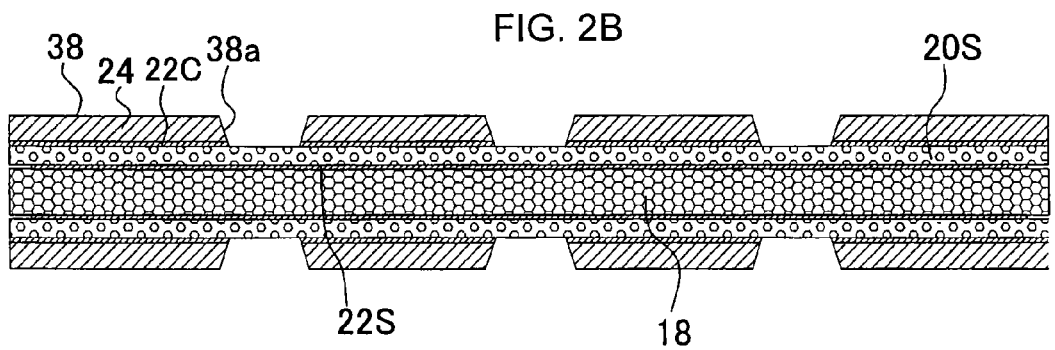

(4) Electrolytic plated film 24 and core metal foil (22C) where no etching resist is formed are etched away to form penetrating hole (38a) (FIG. 2A). Then, the etching resist is removed and middle conductive layer 38 made of electrolytic plated film 24 and core metal foil (22C) is formed (FIG. 2B). Penetrating hole (38a) tapers from the upper surface toward the lower surface of the middle conductive layer. The thickness of middle conductive layer 38 is 50~200 μm.

Figure 2C:
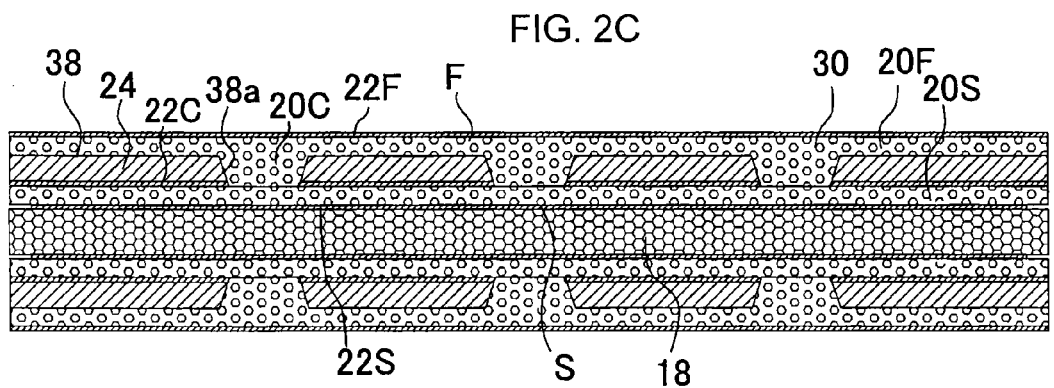

(5) On the first surface of the lower insulation layer and on middle conductive layer 38, upper insulation layer (20F) and upper metal foil (22F) are formed (FIG. 2C). The upper insulation layer also contains inorganic particles the same as above, and includes core material. However, it is also an option for the upper insulation layer not to include core material. Upper metal foil (22F) is copper foil, for example, the same as the lower metal foil, and has a thickness of 25 μm. When upper insulation layer (20F) is laminated, penetrating hole (38a) of the middle conductive layer is filled with resin (20C) derived from upper insulation layer (20F).

Since penetrating hole (38a) is set to taper from the upper surface toward the lower surface in the method for manufacturing a printed wiring board of the present embodiment, resin from the upper-surface side upper insulation layer (20F) is filled more easily, and voids are less likely to occur in penetrating hole (38a).

Figure 2D:
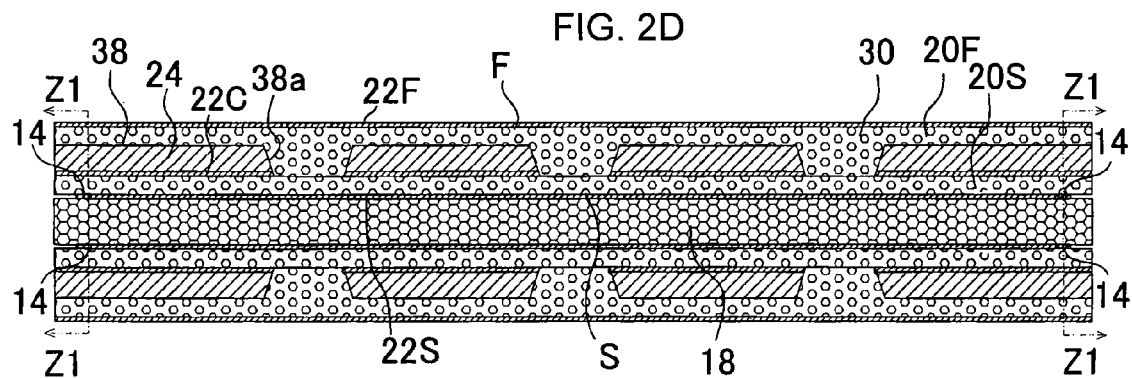
Figure 3A:
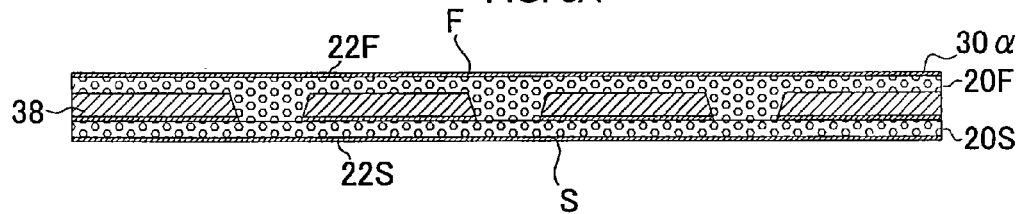
FIG. 3A-3D show views of steps in the method for manufacturing a printed wiring board according to the first embodiment.

(6) The intermediate bodies with the support plate are cut along the (Z1-Z1) lines in FIG. 2D. The cut portions are positioned inside fixed portions 14. Intermediate body (30a) is separated from support plate 18 (FIG. 3A).

Figure 3B:
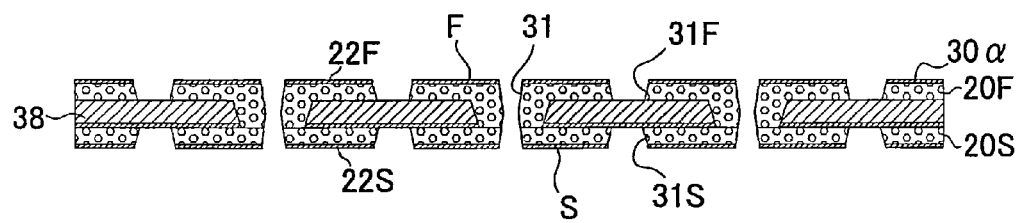

(7) Laser is irradiated on upper insulation layer (20F). Upper opening (31F) is formed in the upper insulation layer to reach middle conductive layer 38. Laser is irradiated on lower insulation layer (20S). Lower opening (31S) is formed in the lower insulation layer to reach middle conductive layer 38. In addition, laser is irradiated on upper insulation layer (20F) and lower insulation layer (20S) to form penetrating hole 31 for a through-hole conductor (FIG. 3B). Upper opening (31F) tapers from the surface of the upper insulation layer toward middle conductive layer 38. Lower opening (31S) tapers from the surface of the lower insulation layer toward middle conductive layer 38. Penetrating hole 31 for a through-hole conductor is formed in an hourglass shape, tapering from the surface of the upper insulation layer while tapering from the surface of the lower insulation layer.

Figure 3C:
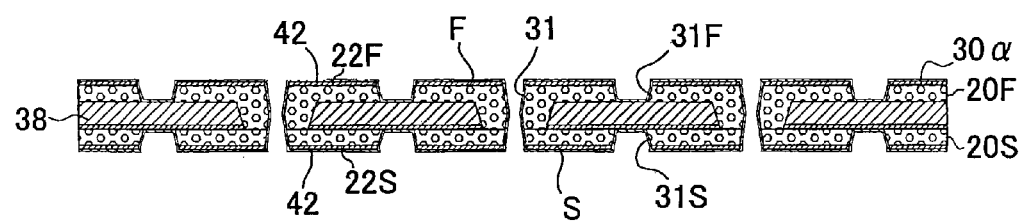

(8) Electroless plated film 42 is formed on upper metal foil (22F) and lower metal foil (22S) and on the inner walls of upper and lower openings (31F, 31S) and of penetrating hole 31 for a through-hole conductor (FIG. 3C).

Figure 3D:
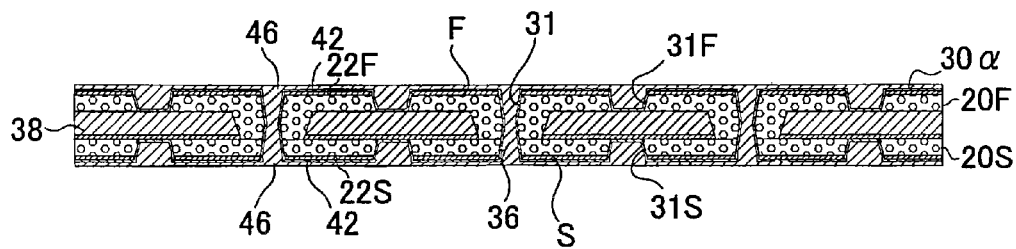

(9) Using the electroless plated film as a seed layer, electrolytic plated film 46 is formed on electroless plated film 42. Upper opening (31F) and lower opening (31S) are filled with electrolytic plated film 46, and electrolytic plated film 46 is formed on electroless plated film 42 positioned on upper metal foil (22F) and lower metal foil (22S) (FIG. 3D).

(10) Etching resist 44 with a predetermined pattern is formed on electrolytic plated film 46 positioned on the first-surface (F) side and second-surface (S) side (FIG. 4A).

(11) Electrolytic plated film 46, electroless plated film 42 and upper metal foil (22F) on the first-surface (F) side where no etching resist is formed, as well as electrolytic plated film 46, electroless plated film 42 and lower metal foil (22S) on the second-surface (S) side where no etching resist is formed, are removed by etching. Then, the etching resist is removed. Accordingly, core substrate 30 is provided with upper conductive layer (34F) made up of electrolytic plated film 46, electroless plated film 42 and upper metal foil (22F) to be positioned on the first-surface (F) side, as well as lower conductive layer (34S) made up of electrolytic plated film 46, electroless plated film 42 and lower metal foil (22S) to be positioned on the second-surface (S) side (FIG. 4B). The thicknesses of upper conductive layer (34F) and lower conductive layer (34S) are each 20 μm.

Figure 4C:
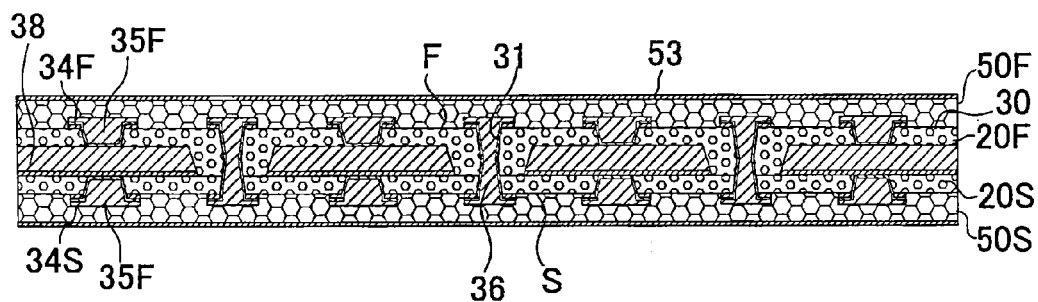

(12) First insulation layer (50F) and metal foil 53 are formed on first surface (F), and second insulation layer (50S) and metal foil 53 are formed on second surface (S) of core substrate 30 (FIG. 4C). First insulation layer (50F) is formed on the first surface of the upper insulation layer and on upper conductive layer (34F). Second insulation layer (50S) is formed on the second surface of the lower insulation layer and on lower conductive layer (34S). The thicknesses of the insulation layers are each 40 μm~60 μm. Metal foil 53 is copper foil, for example, the same as the upper and lower metal foils, and has a thickness of 12 μm. The first and second insulation layers contain inorganic particles and reinforcement material. The material and the thickness of the first and second insulation layers are preferred to be the same as those of the upper and lower insulation layers.

Figure 4D:
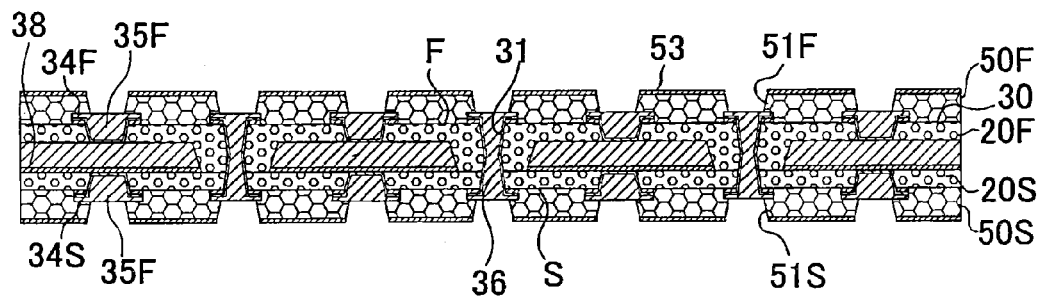

(13) Next, using a CO2 gas laser, first and second via-conductor openings (51F, 51S) are respectively formed in first insulation layer (50F) and second insulation layer (50S) (FIG. 4D).

Figure 5A:
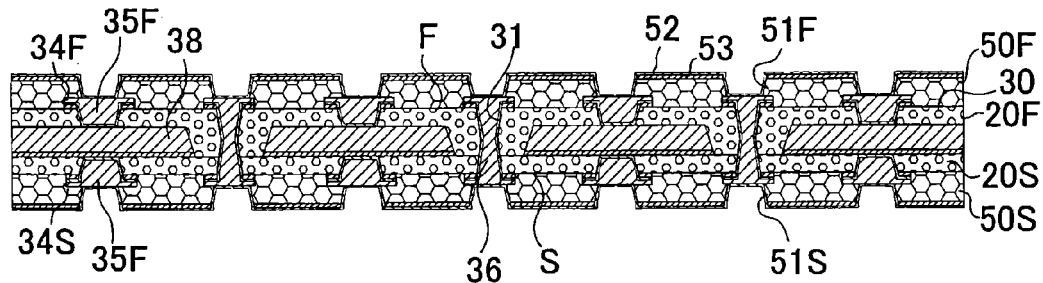
FIG. 5A-5D show views of steps in the method for manufacturing a printed wiring board according to the first embodiment.

(14) Electroless plated film 52 is formed on metal foil 53 positioned on first and second insulation layers (50F, 50S) and in first and second openings (51F, 51S) (FIG. 5A).

Figure 5B:
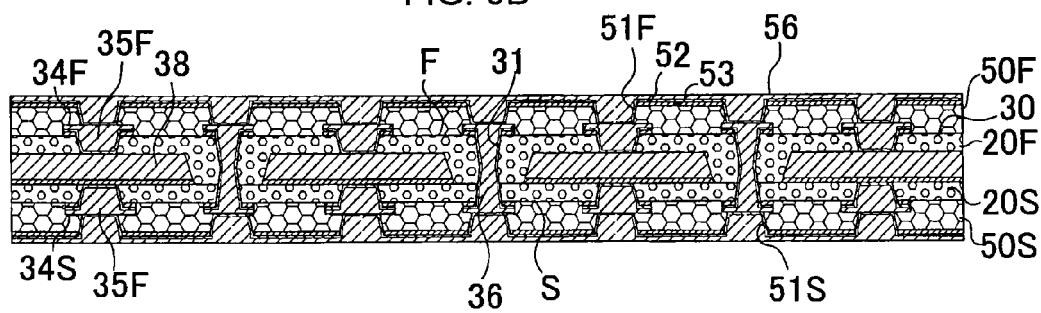

(15) Using the electroless plated film as a seed layer, electrolytic plated film 56 is formed on electroless plated film 52. First opening (51F) and second opening (51S) are filled with electrolytic plated film 56, and electrolytic plated film 56 is formed on electroless plated film 52 positioned on metal foil 53 (FIG. 5B).

Figure 5C:
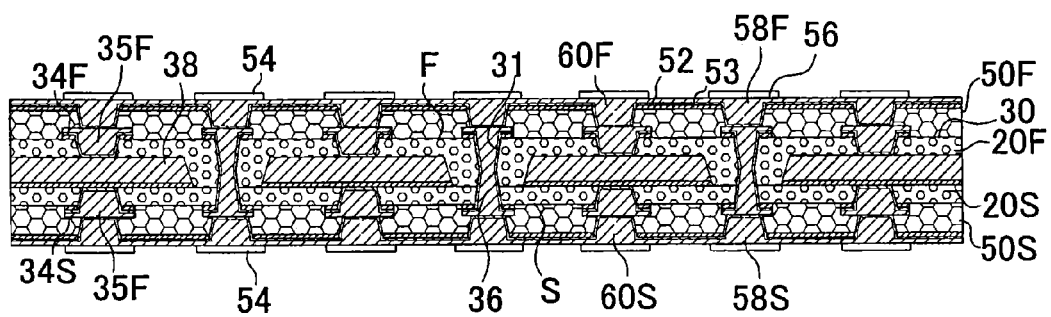

(16) Etching resist 54 with a predetermined pattern is formed on electrolytic plated film 56 (FIG. 5C).

Figure 5D:
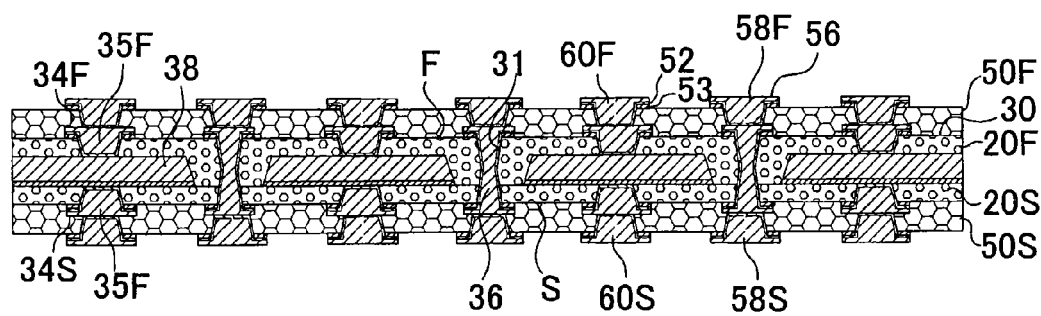

(17) Electrolytic plated film 56, electroless plated film 52 and metal foil 53 where no etching resist is formed are etched away, and the etching resist is removed. Accordingly, first via conductor (60F) is formed in first opening (51F); second via conductor (60S) is formed in second opening (51S); first conductive layer (58F) made of electrolytic plated film 56, electroless plated film 52 and metal foil 53 is formed on the first surface of the first insulation layer; and second conductive layer (58S) made of electrolytic plated film 56, electroless plated film 52 and metal foil 53 is formed on the second surface of the second insulation layer (FIG. 5D).

Figure 6A:
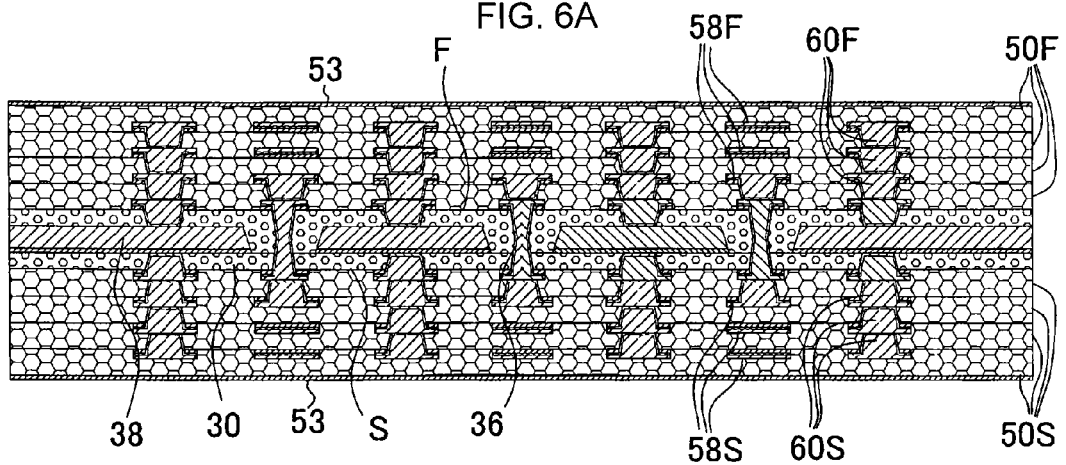
FIG. 6A-6C show views of steps in the method for manufacturing a printed wiring board according to the first embodiment.

(18) Procedures described with reference to FIG. 4C~5D are repeated so that two layers of first insulation layers (50F) each having first conductive layer (58F) and first via conductor (60F), along with two layers of second insulation layers (50S) each having second conductive layer (58S) and second via conductor (60S), are further built up. Then, first insulation layer (50F), second insulation layer (50S) and metal foil 53 are further laminated as outermost layers (FIG. 6A).

Figure 6B:
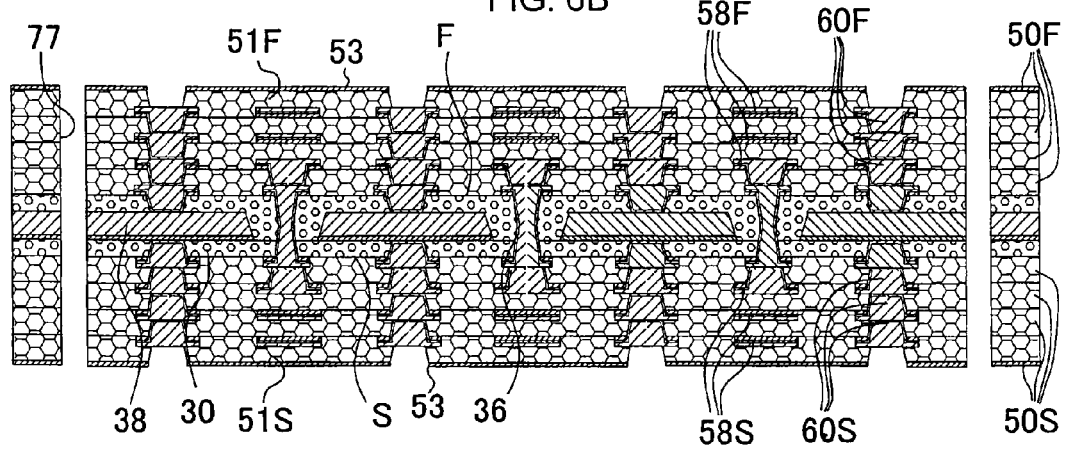
Figure 9A:
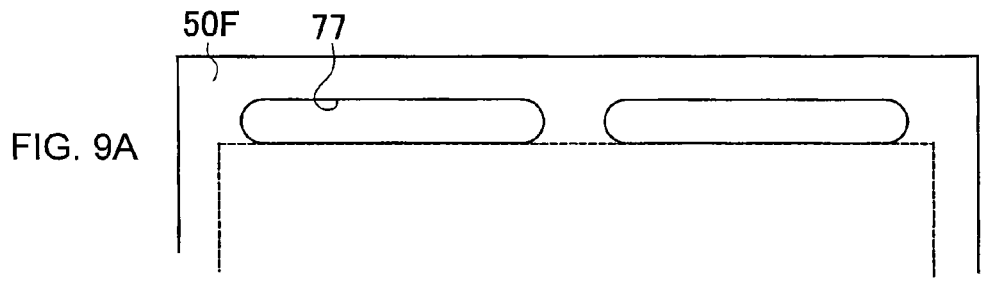
FIG. 9A-9E show plan views of steps in the method for manufacturing a printed wiring board according to the first embodiment.

(19) Using a CO2 gas laser, first via conductor opening (51F) and second via conductor opening (51S) are respectively formed in outermost first insulation layer (50F) and outermost second insulation layer (50S). Elliptical penetrating hole 77 for a through-hole conductor is formed by dicing an edge of the printed wiring board (FIG. 6B). FIG. 9A is a plan view of penetrating hole 77 for a through-hole conductor shown in FIG. 6B.

Figure 6C:
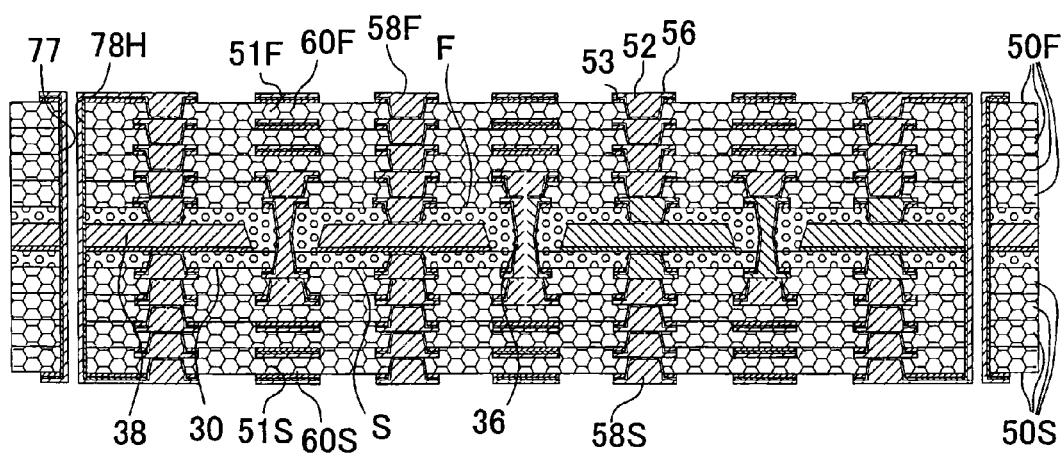
Figure 9B:
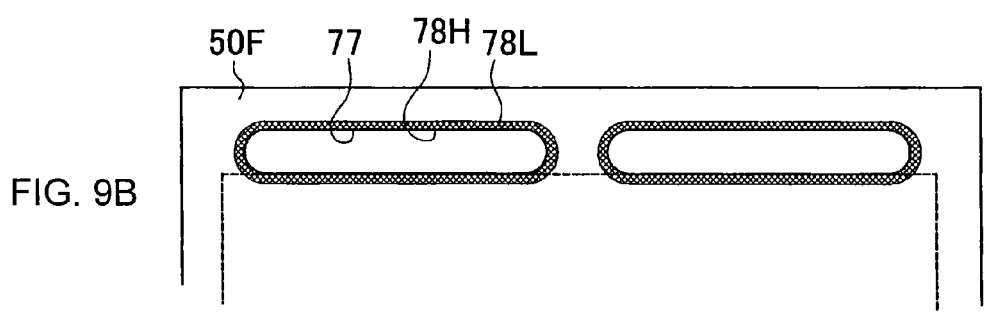

(20) Procedures described with reference to FIG. 5A~5D are repeated so that first conductive layer (58F) and via conductor (60F) are provided for outermost first insulation layer (50F), and second conductive layer (58S) and via conductor (60S) are provided for outermost second insulation layer (50S). At the same time, through-hole conductor (78H) is formed in penetrating hole 77 for a through-hole conductor (FIG. 6C). FIG. 9B is a plan view of through-hole conductor (78H) shown in FIG. 6C. Here, the thicknesses of first conductive layer (58F) and second conductive layer (58S) are each 20 μm.

Figure 9C:
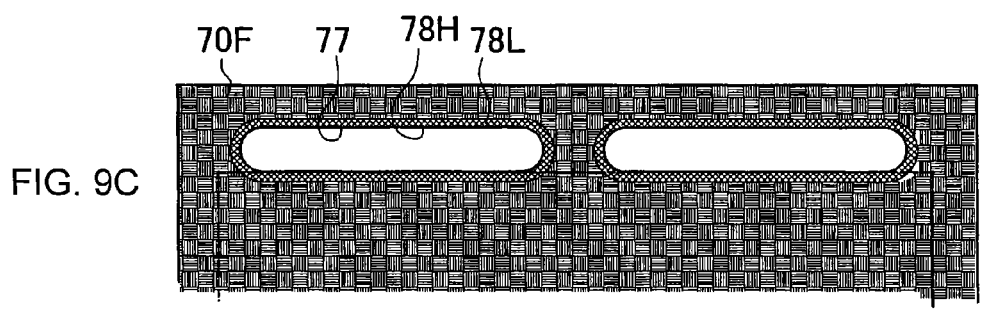

(21) Upper solder-resist layer (70F) having opening (71F) is formed on uppermost first insulation layer (50F), and lower solder-resist layer (70S) having opening (71S) is formed on lowermost second insulation layer (50S) (FIG. 7A). Through-hole conductor (78H) and through-hole land (78L) are exposed from the solder-resist layer. FIG. 9C is a plan view of through-hole conductor (78H) shown in FIG. 7A. Upper surfaces of conductive layers (58F, 58S) and via conductors (60F, 60S) that are exposed respectively from openings (71F, 71S) work as pads (71FP, 71SP).

Figure 9D:
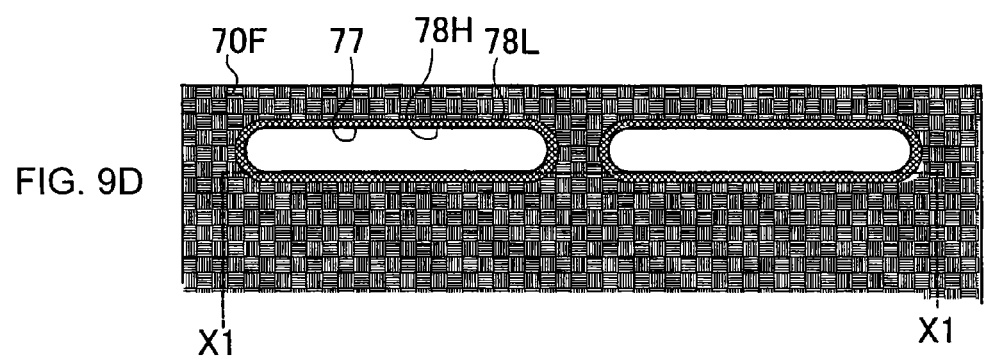
Figure 9E:
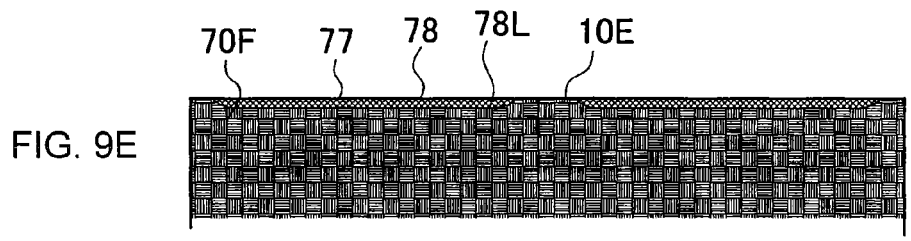

(22) As shown in FIG. 7B, the printed wiring board is cut along the (X1-X1) line, which is the end surface inside elliptical through-hole conductor (78H), so that end-surface through hole 78 is formed on an end surface of the printed wiring board (FIG. 7C). FIG. 9D is a plan view of through-hole conductor 78(H) shown in FIG. 7B, and FIG. 9E is a plan view of end-surface through hole 78 shown in FIG. 7C.

Nickel-plated layer 72 is formed on pads (71 FP, 71 SP) exposed from the solder-resist layers and on end-surface through hole 78, and gold-plated layer 74 is further formed on nickel-plated layer 72. By so setting, oxidation of end-surface through hole 78 is prevented. Solder paste is provided in openings (71F, 71S), and reflow is conducted. Accordingly, solder bump (76F) is formed on the upper buildup layer, and solder bump (76S) is formed on the lower buildup layer. Printed wiring board 10 is completed (FIG. 8A).

Since the method for manufacturing a printed wiring board of the first embodiment is set to have a structure where middle conductive layer 38 is formed in the center of core substrate 30, warping is suppressed because of the rigidity of middle conductive layer 38, while demand for a thinner board is satisfied. Also, since a core substrate is formed on support plate 18, which is subsequently removed, a core substrate structured to have a middle conductive layer is obtained by simplified procedures. Accordingly, manufacturing cost is reduced, while manufacturing yield is enhanced.

First Modified Example of First Embodiment

Figure 10:
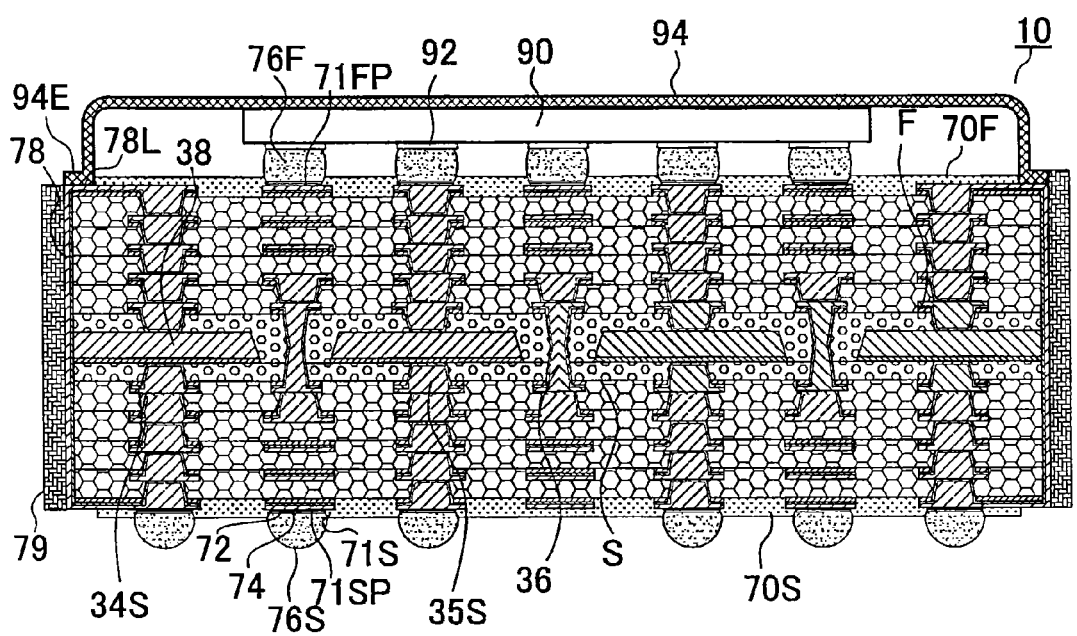
FIG. 10 shows a cross-sectional view of a printed wiring board according to a first modified example of the first embodiment.

FIG. 10 is a view showing a printed wiring board according to a first modified example of the first embodiment. In a printed wiring board of the first modified example, a heat-radiation sheet 79 is provided on end-surface through hole 78, and heat radiation capability is further enhanced.

Second Modified Example of First Embodiment

Figure 11:
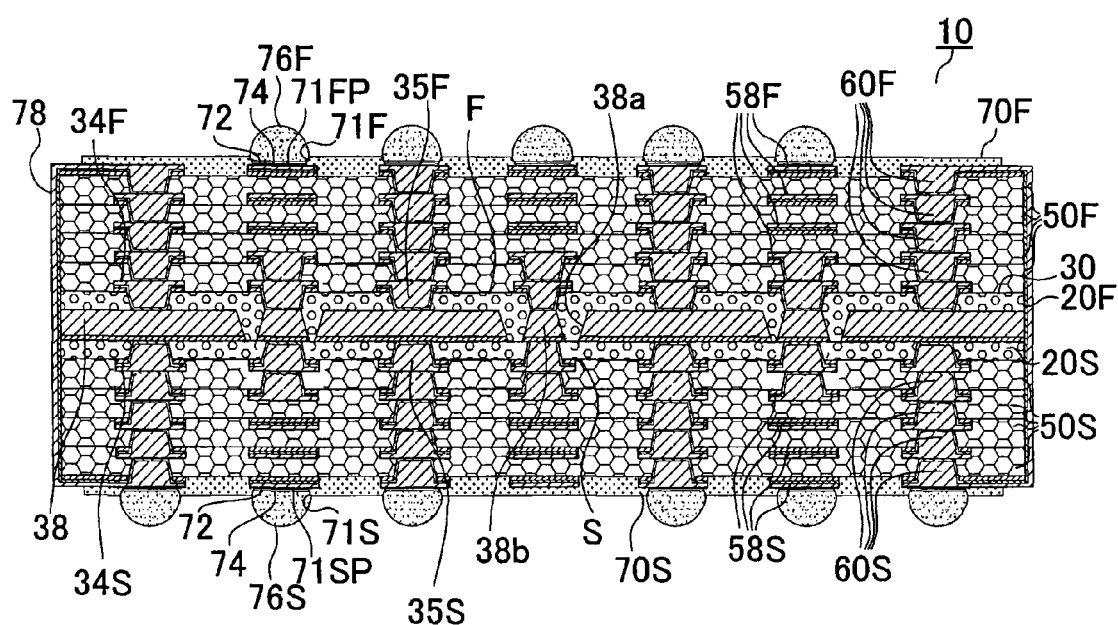
FIG. 11 shows a cross-sectional view of a printed wiring board according to a second modified example of the first embodiment.

FIG. 11 is a view showing a printed wiring board according to a second modified example of the first embodiment. In a printed wiring board of the second modified example, metal core piece (38b) is formed, being insulated by resin filled in penetrating hole (38a) of metal core 38. Via conductor (35F) formed in upper insulation layer (20F) and via conductor (35S) formed in lower insulation layer (20S) are connected to metal core piece (38b), and first insulation layer (50F) and second insulation layer (50S) are joined.

As electronic devices get thinner, built-in printed wiring boards are required to be thinner. When a printed wiring board is made thinner, the rigidity of insulation layers decreases and warping or the like tends to occur. A highly rigid metal plate may be used inside a core substrate for a multilayer buildup printed wiring board with buildup layers formed on a core substrate. Use of a metal plate also improves the thermal conductivity of a printed wiring board.

In a printed wiring board formed with a metal core, heat is conducted to the metal core, but the heat is hard to release from the metal core efficiently because the metal core is structured to be sandwiched by resin insulation layers with low heat conductivity.

A printed wiring board according to an embodiment of the present invention exhibits high heat radiation capability.

A printed wiring board according to one aspect of the present invention has the following: a multilayer core substrate which is formed with three—upper, middle and lower—conductive layers, an upper insulation layer disposed between the upper and middle conductive layers, and a lower insulation layer disposed between the middle and lower conductive layers, and which includes an upper via conductor that penetrates through the upper insulation layer and connects the upper conductive layer and the middle conductive layer, and a lower via conductor that penetrates through the lower insulation layer and connects the middle conductive layer and the lower conductive layer; an upper-surface side buildup layer formed on the upper surface of the multilayer core substrate and made up of interlayer resin insulation layers and conductive layers; a lower-surface side buildup layer formed on the lower surface of the multilayer core substrate and made up of interlayer resin insulation layers and conductive layers; and an end-surface through hole that connects the conductive layers of the upper-surface side buildup layer and the conductive layers of the lower-surface side buildup layer. In such a printed wiring board, the middle conductive layer is formed to be thicker than any of the upper conductive layer and lower conductive layer, and is connected to the end-surface through hole.

In a printed wiring board according to one aspect of the present invention, the middle conductive layer formed to be thick in the center of the core substrate is connected to an end-surface through hole provided at an end surface of the printed wiring board. Thus, heat generated in the printed wiring board is efficiently radiated by way of the end-surface through hole. Accordingly, the printed wiring board has a high heat radiation capability.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a multilayer core substrate;
   a first buildup layer formed on a first surface of the multilayer core substrate and comprising an interlayer resin insulation layer and a conductive layer;
   a second buildup layer formed on a second surface of the multilayer core substrate and comprising an interlayer resin insulation layer and a conductive layer; and
   an end-surface through hole conductor formed along a side surface of the first buildup layer, a side surface of the multilayer core substrate and a side surface of the second buildup layer such that the end-surface through hole conductor is connecting the conductive layer of the first buildup layer and the conductive layer of the second buildup layer,
   wherein the multilayer core substrate includes a first conductive layer, a middle conductive layer, a second conductive layer, a first insulation layer interposed between the first conductive layer and the middle conductive layer and a second insulation layer interposed between the second conductive layer and the middle conductive layer, and the middle conductive layer is connected to the end-surface through-hole conductor and has a thickness which is greater than thicknesses of the first and second conductive layers.

2. A printed wiring board according to claim 1, wherein the multilayer core substrate includes a first via conductor connecting the first conductive layer and the middle conductive layer, and a second via conductor connecting the second conductive layer and the middle conductive layer.

3. A printed wiring board according to claim 2, wherein the conductive layer of the first buildup layer is an outermost conductive layer formed on an outermost interlayer resin insulation layer of the first buildup layer, and the conductive layer of the second buildup layer is an outermost conductive layer formed on an outermost interlayer resin insulation layer of the second buildup layer.

4. A printed wiring board according to claim 2, wherein the middle conductive layer has a penetrating hole, and the multilayer core substrate includes a through-hole conductor formed through the penetrating hole such that the through-hole conductor is connecting the first conductive layer and the second conductive layer.

5. A printed wiring board according to claim 2, wherein the first via conductor and the second via conductor are positioned such that the first via conductor and the second via conductor are aligned across the middle conductive layer, the first buildup layer includes a first filled via structure formed on the first via conductor such that the first filled via structure is aligned with the first via conductor and formed through the first buildup layer, and the second buildup layer includes a second filled via structure formed on the second via conductor such that the second filled via structure is aligned with the second via conductor and formed through the second buildup layer.

6. A printed wiring board according to claim 2, wherein the middle conductive layer is connected to one of a power line and a grounding line.

7. A printed wiring board according to claim 2, wherein the middle conductive layer has a penetrating hole tapering from the first insulation layer toward the second insulation layer and filled with a resin material derived from the first insulation layer.

8. A printed wiring board according to claim 2, wherein the middle conductive layer comprises a metal foil and a copper plated layer.

9. A printed wiring board according to claim 2, further comprising:
a heat-radiation device formed on the first buildup layer and having an end portion connected to the end-surface through hole conductor.

10. A printed wiring board according to claim 2, further comprising:
an electronic component mounted on the first buildup layer; and
a heat-radiation device formed on the first buildup layer and having an end portion connected to the end-surface through hole conductor such that the heat-radiation device is in contact with the electronic component.

11. A printed wiring board according to claim 2, wherein the first buildup layer includes a plurality of interlayer resin insulation layers and a plurality of conductive layers, and the second buildup layer includes a plurality of interlayer resin insulation layers and a plurality of conductive layers.

12. A printed wiring board according to claim 11, wherein the first via conductor and the second via conductor are positioned such that the first via conductor and the second via conductor are aligned across the middle conductive layer, the first buildup layer includes a first filled via structure comprising a plurality of filled via conductors and formed on the first via conductor such that the filled via conductors in the first filled via structure are aligned with the first via conductor and formed through the first buildup layer, and the second buildup layer includes a second filled via structure comprising a plurality of filled via conductors and formed on the second via conductor such that the filled via conductors in the second filled via structure are aligned with the second via conductor and formed through the second buildup layer.

13. A printed wiring board according to claim 2, further comprising:
an IC chip mounted on the first buildup layer; and
a heat-radiation cap device formed on the first buildup layer and having an end portion connected to the end-surface through hole conductor such that the heat-radiation cap device is in contact with the IC chip.

14. A printed wiring board according to claim 2, further comprising:
a heat-radiation sheet positioned on the end-surface through hole conductor.

15. A printed wiring board according to claim 1, wherein the conductive layer of the first buildup layer is an outermost conductive layer formed on an outermost interlayer resin insulation layer of the first buildup layer, and the conductive layer of the second buildup layer is an outermost conductive layer formed on an outermost interlayer resin insulation layer of the second buildup layer.

16. A printed wiring board according to claim 1, wherein the middle conductive layer has a penetrating hole, and the multilayer core substrate includes a through-hole conductor formed through the penetrating hole such that the through-hole conductor is connecting the first conductive layer and the second conductive layer.

17. A printed wiring board according to claim 1, wherein the middle conductive layer is connected to one of a power line and a grounding line.

18. A printed wiring board according to claim 1, wherein the middle conductive layer has a penetrating hole tapering from the first insulation layer toward the second insulation layer and filled with a resin material derived from the first insulation layer.

19. A printed wiring board according to claim 1, wherein the middle conductive layer comprises a metal foil and a copper plated film.

20. A printed wiring board according to claim 1, further comprising:
a plated layer structure formed on a surface of the end-surface through hole conductor such that the plated layer structure prevents oxidation of the end-surface through hole conductor.

* * * * *